United States Patent [19]
Grno

[11] Patent Number: 6,118,268
[45] Date of Patent: Sep. 12, 2000

[54] THERMOELECTRIC MEASURING DEVICE

[76] Inventor: Ladislav Grno, Ipelská 3.821 07, Bratislava, Slovakia

[21] Appl. No.: 09/020,567

[22] Filed: Jan. 22, 1998

Related U.S. Application Data

[63] Continuation of application No. PCT/IB96/00743, Jul. 24, 1996.

[30] Foreign Application Priority Data

Jul. 25, 1995 [DE] Germany .......................... 195 270 35

[51] Int. Cl.[7] .................................................. G01R 21/02

[52] U.S. Cl. .......................... 324/105; 324/106; 327/358; 327/356

[58] Field of Search .................................... 327/356, 358, 327/361; 324/105, 106

[56] References Cited

U.S. PATENT DOCUMENTS 5,291,073  3/1994  Lewandowski .

FOREIGN PATENT DOCUMENTS

| 1707 | 5/1979 | European Pat. Off. . |
| 320265 | 6/1989 | European Pat. Off. . |
| 4117133 | 11/1992 | Germany . |

*Primary Examiner*—Josie Ballato
*Assistant Examiner*—Jose M. Solis
*Attorney, Agent, or Firm*—Schweitzer Cornman Gross & Bondell LLP

[57] ABSTRACT

A thermoelectric measurement converter is disclosed, which forms the output signal as the product of the instantaneous values of two input signals; wherein the measurement converter comprises at least one electronic resistor and at least one temperature sensor, both being disposed on a common base which is heat insulated with respect to the environment.

4 Claims, 3 Drawing Sheets

THERMOELECTRIC MEASURING DEVICE

This is a continuation of international application PCT/IB96/00743, filed on Jul. 24, 1996.

FIELD OF THE INVENTION

The invention relates to a thermoelectric measurement converter for measuring the electric power and energy, which are defined as a product of two measured quantities.

BACKGROUND

Conventional measurement converters for measuring electronic power are based on the principle of the electromechanical conversion of the product of the voltage and the current into a mechanical moment of force. It is regarded to be a disadvantage of this electromechanical conversion that the conversion is possible only within a narrow frequency range and that the conversion accuracy is only slight.

Advances in the field of electronics led to electronic measurement converters. Known electronic measurement converters for the precision measurement of electric power generally consist of circuits, which convert the instantaneous values of the input signals into pulse or digital signals for the subsequent processing. The disadvantage of these circuits consists therein that, because of the scanning principle, the accuracy of measurement at higher frequencies is limited by the scanning frequency. The conventional semi-conductor elements limit the maximum frequency of the measurement signals to values between $10^3$ and $10^5$ Hz, depending on the measurement accuracy required. The conversion error attained hereby is about $10^{-4}$ (Seppa et al., "A Digital Three-Phase Watthour Meter", Conference on Precision Electromagnetic Measurements, Conference Digest, Ottawa, June 1990).

Interference between the measurement frequency and the scanning frequency, as well as the problematic processing of pulse signals are also regarded as disadvantages of equipment using the scanning principle.

Multiplier equipment, based on non-linear circuits or on the Hall effect, admittedly is structurally simple; however, a higher accuracy of measurement and a long-term stability are not possible with such equipment. Circuits, based on square characteristics of the diodes (U.S. Pat. No. 5,266,888), can be used only with reduced measurement accuracy to approximate the effective values of the individual input signals.

The most accurate methods for measuring electric power are based on thermal effects. For these methods, thermoelectric converters are used. Conventional thermoelectric converters can convert only the effective value of a signal, such as voltage, current, TEM wave (DE 35 39 402 C2, DE 34 28 077 A1) or beam power (DE 42 43 597 C2, DE 34 08 724 C2). Also known are thermoelectric converters, which utilize the temperature-dependent resistance of thermistors for measuring the effective value of the voltage (U.S. Pat. No. 5,189,362). Power, which is determined by two independent signals, can be measured only indirectly with the help of these conventional thermoelectric converters, by the effective values of the linear combinations of input signals. In the best cases, the error of measurement is about $10^{-5}$ here. The power is measured indirectly by the effective values of linear combinations of input signals. The measurement error is about $10^{-5}$ here. These thermoelectric converters, however, have a complicated construction and therefore are expensive. (K. Takahashi, S. Kusui, "A Precision Thermal Wattmeter Having a Sampling Control System and an Analog Feedback Loop", Conference on Precision Electromagnetic Measurements, Conference Digest, Ottawa, June 1990).

Thermal multiplication by means of a controlled resistance and by means of a temperature sensor, both of which are disposed on a common support insulated from the environment (DE 4117133 C1) is also known. The sensitivity to the direct current portion of the signals to be measured and the effect of lead wire resistances on the accuracy of measurement are disadvantages of this simple arrangement.

For the conventional thermal insulation of load resistances of the thermoelectric measurement converter, a thin dielectric membrane, consisting of several layers, is used (M. Klonz, "Current Developments in Accurate AC-DC Difference Measurements", Conference Digest, Boulder, Colo., USA, 1994). In the case of a different, known solution for thermal insulation, an island, produced by etching, is provided within a substrate and only the solid, metal wire leads to the electronic components are mechanically fixed on this island (U.S. Pat. No. 4,257,061 and L. Harold Slott, "A Multirange Standard for AC/DC Difference Measurements", IEEE Trans. on Inst. and Meas. Im-35, No. 4, Dec. 1986). These lead wires must be produced from a material, that has a high ratio of electrical conductivity to thermal conductivity. The disadvantage of the simple membrane is the problematic mechanical stability to stresses, which are caused by temperature gradients in the membrane. The production of multilayered membranes is technologically complicated and therefore expensive. The complicated and, with that, expensive manufacturing process is a disadvantage of the construction, in which the lead wires are fixed to the free island.

OBJECT OF THE INVENTION

Starting out from the above state of the art, it is an object of the invention to develop further a thermoelectric measurement converter for measuring electric power and energy and a method for its manufacture in such a manner, that the disadvantages mentioned, are largely avoided and the manufacturing costs are minimized.

SUMMARY OF THE INVENTION

The objective is accomplished by the distinguishing features of claim 1.

The essence of the inventive thermoelectric measurement converter, which consists of an electronically controllable resistance, the resistance value of which can be controlled electronically by the instantaneous value of the input signal, and a temperature sensor, both of which are disposed on a support that is thermally insulated from the environment, consists therein that the output signal of the measurement converter is generated by means of a summing unit as a linear combination of the input signal and the signal derived from the temperature sensor. This arrangement also makes it possible to measure those input signals, which have a direct current portion.

In view of minimizing the transformation error, which arises in the wires because of Joule's losses, it is advantageous to construct the lead wires to the load resistance as potential electrodes. The optimum position of the potential electrodes is the site of the thermally insulated part, which is disposed between the load resistance and the supporting substrate.

The measurement error, which arises because of the parasitic, capacitive transfer of the control signal from the controllable resistance in the measurement signal channel, can be minimized by a shielding electrode, which is disposed between the lead wire to the control electrode and the lead wire to the controllable resistance.

Some sources of measurement error can be eliminated mathematically by evaluating the measurement of different combinations of the input signal in relation to a reference signal. For this reason, the circuit is advantageously provided with an electronically controlled changeover switch, which supplies the combination of the input signals in relation to the reference zero signal at the inputs of the measurement converter.

A second, controllable resistance on the common support, which is insulated thermally from the environment, enables the thermal effect of the power change of the first controllable resistance to be compensated for automatically by means of a control unit, which controls the output of the second resistance. The second resistance is connected to the outlet of the control unit, the input signal of the control unit being derived from the temperature sensor. The accuracy of this compensation is improved owing to the fact that the control unit is provided with an electronic multiplier, to the inputs of which signals are supplied, which are derived directly or indirectly from the input signals, and owing to the fact that the output signal of the multiplier is added to the control signal of the second resistance.

Optimum from the point of view of suppressing the influence of the ambient temperature is a double structure, which comprises two separate supports, which are disposed symmetrically with respect to the heat flowing in from the environment. At each of the two supports, advantageously two controllable resistances and a temperature are disposed symmetrically in the axis of symmetry of the resistances. It is possible to minimize the measurement error, which is caused because of the thermal asymmetry of the converter so formed, by a homogenizing metal layer, which is disposed at the thermally insulated supports at the site of the resistances. Advantageously, the thickness of the homogenizing metal layer is greater than the thickness of the thermally insulated support, multiplied by the ratio of the thermal conductivity of the material of the thermally insulated support to the thermal conductivity of the material of the metal layers. These supports are constructed as membranes, which cover one or two openings in a common substrate partly or completely.

At each of the two supports, two controllable resistances are disposed, in the axis of symmetry of which there is a temperature sensor.

The measurement error, which is caused by the thermal asymmetry of the converter formed, can be minimized by a homogenizing metal layer, which is disposed at the thermally insulated support at the site of the resistances. In an advantageous manner, the thickness of the homogenizing metal layer is greater than the thickness of the thermally insulated support, multiplied by the ratio of the thermal conductivity of the material of the thermally insulated support to the thermal conductivity of the material of the metal layer.

When the homogenizing metal layer consists of material, the temperature conductivity of which, which is defined as the ratio of the thermal conductivity to the heat capacity per unit volume, is greater than the temperature conductivity of the material of the thermally insulated support, the thermal equilibration after a rapid signal change is accelerated, as a result of which the accuracy of the measurement is improved.

The thermoelectric measurement converter, the supporting substrate of which, carrying the thermally insulated supports, is provided directly or indirectly with one or several Peltier thermocouples, makes it possible to limit the temperature of the active elements of the measurement converter by cooling to a range with small parasitic flows and low noise and, with that, to increase the accuracy of the measurement.

In an advantageous method for producing the monolithic, thin membrane, which serves as thermally insulated support, and the integrated, active and passive elements of the measurement converter, a stop layer, a high-resistance separating layer and at least one active layer are formed consecutively on a supporting substrate by epitaxial growth. The semiconductor elements are produced in the active layer. The three-dimensional structure of the measurement converter is then produced by selective etching from the side of the active layer and the side of the supporting substrate without attack on the stop layer.

BRIEF DESCRIPTION OF THE DRAWING

The invention is now explained in greater detail by means of an example, which is shown diagrammatically in the drawing, in which.

DETAILED DESCRIPTION

Figure 1:
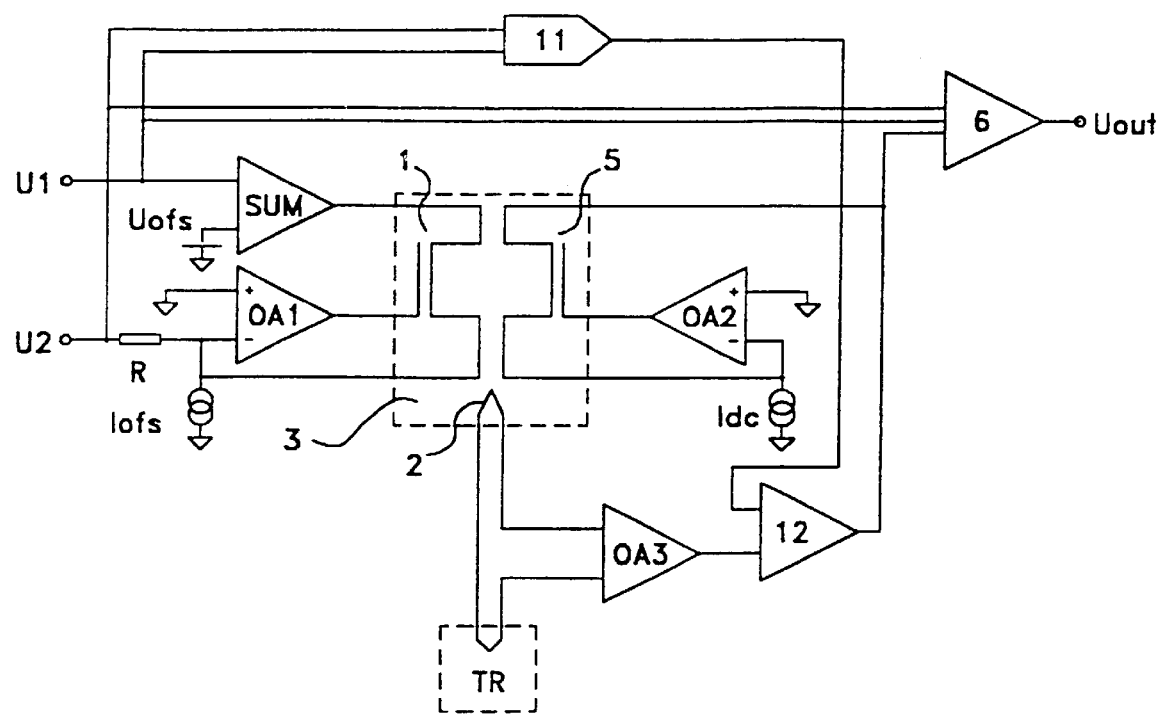
FIG. 1 shows a circuit diagram of a thermoelectric measurement converter.

In FIG. 1, two FET transistors 1 and 5 are shown as controlled resistances at a thermally insulated support 3. A temperature sensor 2, disposed in a differential circuit, measures the temperature difference between this support and the reference body TR. An operational amplifier OA1 controls the current of the transistor 1. An operational amplifier OA2 controls the current of the transistor 5. An operational amplifier OA3 controls the voltage and, with that, the output of the transistor 5, in order to maintain the temperature equilibrium between the thermally insulated support 3 and the reference body TR. This compensates automatically for the thermal effect of the change in the output of the transistor 1 by the change in the output of the transistor 5. The response of the control loop to the input signal is accelerated by an electronic multiplier 11. The direct current portions of the input signals are compensated for by a summing unit 6, the output signal $U_{out}$ of which is the linear combination of the input signals U1 and U2 and of that signal, which is derived from the output signal of the temperature sensor 2.

Figure 2:
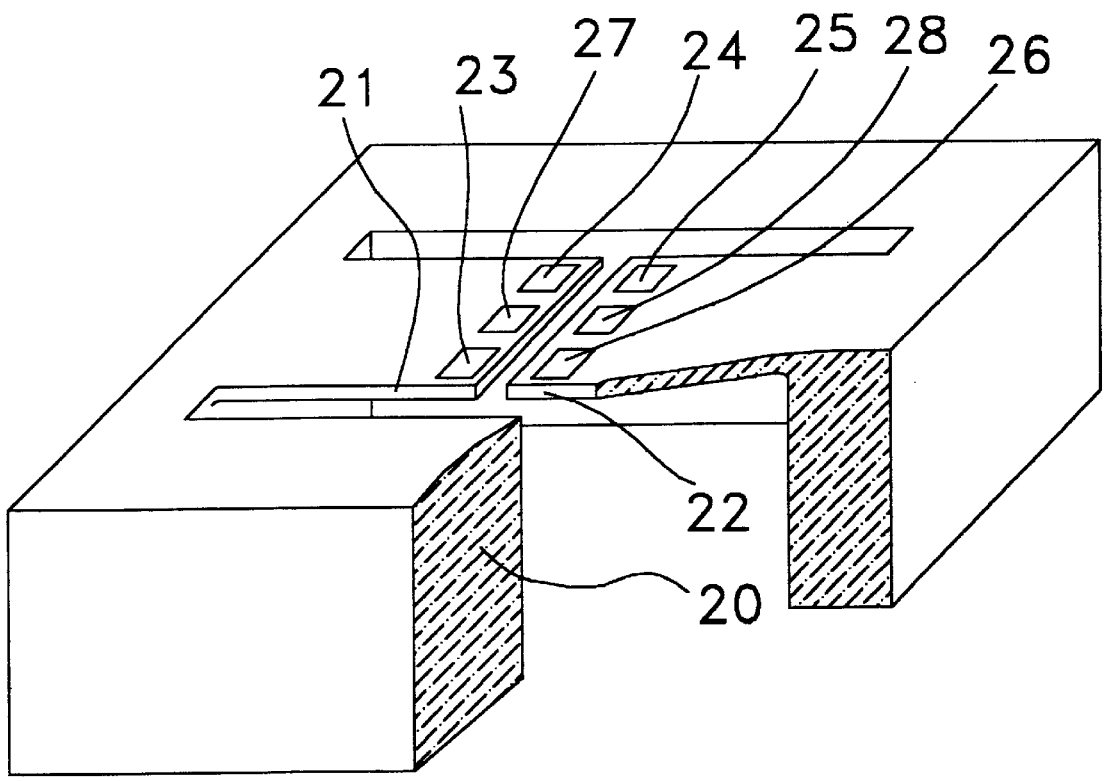
FIG. 2 shows a perspective view of the thermally insulated part of a symmetrical, thermoelectric measurement converter.

FIG. 2 shows a construction of the thermally insulated part of a symmetrical thermoelectric measurement converter. The thermally insulated support 3 has the shape of a panel, which is held on one side by a supporting substrate 4. The measurement converter is provided with a second thermally insulated support 14 with the resistance 5 and a temperature sensor 15. This second support 14 is constructed symmetrically with respect to environmental disorders and can be used to compensate for the effect of a change in the ambient temperature or for supplying a comparison signal, when the thermoelectric measurement converter is used as comparator.

Figure 3:
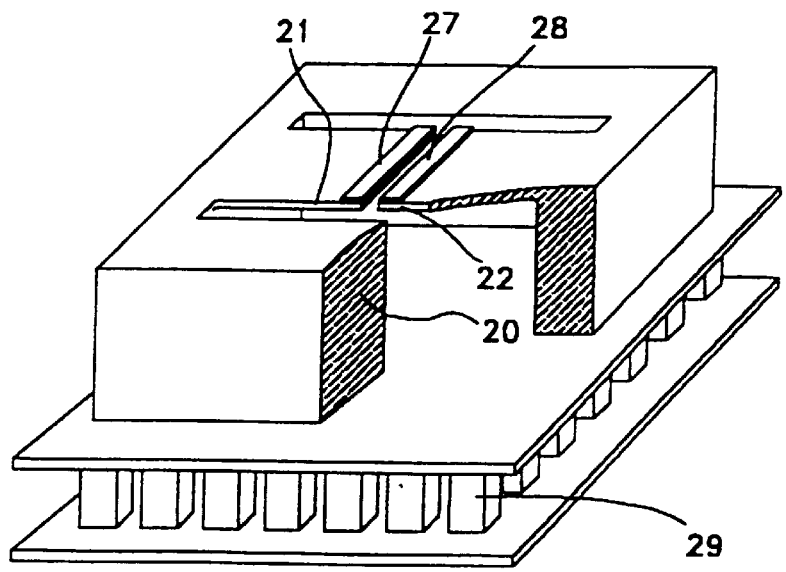
FIG. 3 shows a perspective view of a thermally insulated part of a symmetrical, thermoelectric measurement converter with a homogenizing metal layer and a thermally insulated support, which is provided with several Peltier thermocouples

FIG. 3 shows a construction of a symmetrical, thermoelectric measurement converter, which is equipped with a homogenizing metal layer 27 and 28. A substrate 20 of the measurement converter is in contact with several thermoelectric Peltier elements 29.

Figure 4:
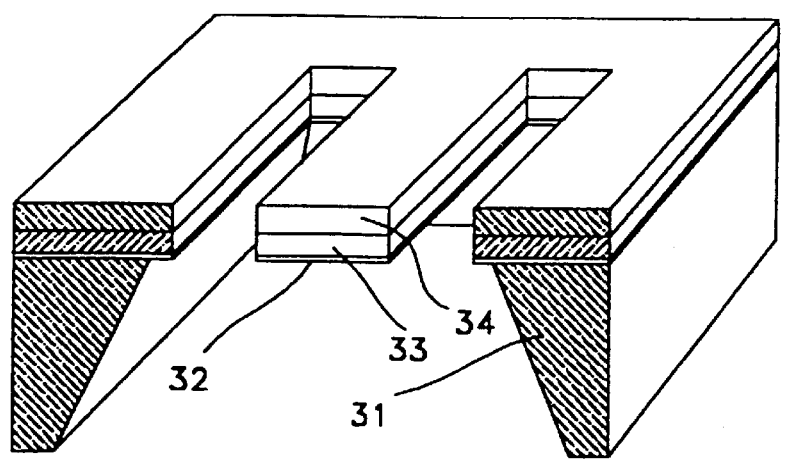
FIG. 4 shows a perspective view of a three-dimensional structure of the thermoelectric measurement converter, which can be produced by epitaxial growth and then by selective etching.

FIG. 4 shows a three dimensional structure of the measurement converter, which is built up by epitaxial growth and two-sided etching. A stop layer 32, a high resistance separating layer 33 and an active layer 34 are applied consecutively on a support substrate 31 by epitaxial growth. The semiconductor elements are produced in the active layer. The three dimensional structure of the measurement converter is then produced by a selective etching from the side of the active layer and the side of the support substrate. This active etching does not attack the stop layer 32.

The inventive thermoelectric measurement converter can be used in the field of measuring electric power and energy as well as for signal processing.

We claim:

1. A thermoelectric measuring device for forming an output signal that is an adjusted product of the of the values of two input signals, which comprises at least one resistance, the resistance value of which can be electronically controlled by the value of the input signals, and at least one temperature sensor for producing a correction signal, said resistance and said sensor being disposed on a common support that is thermally insulated from the environment, and a summing unit for forming a combination of a product of said input signals and of said correction signal.

2. The device of claim 1, wherein said resistance is a transistor.

3. The device of claim 2, wherein said transistor is a field effect transistor.

4. The device of claim 1, wherein said resistor is a first resistor, the device further comprising a control unit for automatically compensating a thermal effect resulting by a power change through said first resistor, a multiplier in said control unit, an input to said multiplier being connected from said input signals, an input to said summing unit being connected from an output of said multiplier, and a second resistor disposed on said common support, the voltage or current signal of said second resistor being controllable from said control unit.

* * * * *